United States Patent [19]

Kurihara et al.

[11] Patent Number: 4,649,990
[45] Date of Patent: Mar. 17, 1987

[54] HEAT-CONDUCTING COOLING MODULE

[75] Inventors: Yasutoshi Kurihara, Katsuta; Tasao Soga; Hiroaki Hachino, both of Hitachi; Kenji Miyata, Katsuta; Masahiro Okamura, Hitachi; Fumiyuki Kobayashi, Sagamihara; Takahiro Daikoku, Ibaraki, all of Japan

[73] Assignee: Hitachi, Ltd., Tokyo, Japan

[21] Appl. No.: 730,642

[22] Filed: May 6, 1985

[51] Int. Cl.⁴ .............................................. F28F 7/00
[52] U.S. Cl. ................................. 165/80.4; 165/185; 357/81
[58] Field of Search .................. 165/80.2, 80.3, 80.4, 165/185; 357/81, 82

[56] References Cited

U.S. PATENT DOCUMENTS 4,153,107  5/1979  Antonetti et al. ............... 357/81 X
4,167,771  9/1979  Simons ........................... 165/185 X
4,226,281 10/1980  Chu ................................ 165/185 X Primary Examiner—William R. Cline
Attorney, Agent, or Firm—Antonelli, Terry & Wands

[57] ABSTRACT

A heat-conducting cooling module for cooling a semiconductor substrate in an integrated circuit package assembly in which a semiconductor substrate is mounted on a base board by small solder pellets, and which contains a single substrate or laminated substrates. A heat-conducting relay member is provided between the semiconductor substrate and a housing so as to be pressed onto the semiconductor substrate. At least either one of the housing or the heat-conducting relay member is made of a sintered product which includes silicon carbide as a chief component.

12 Claims, 10 Drawing Figures

HEAT-CONDUCTING COOLING MODULE

BACKGROUND OF THE INVENTION

The present invention relates to a heat-conducting cooling module for cooling a semiconductor substrate in an integrated circuit package assembly in which a semiconductor substrate is mounted on a base board by small solder pellets, and which contains a single substrate or laminated substrates.

It is essential for large electronic computers to operate at high speeds and, for this purpose, a semiconductor device or a large-scale integrated circuit (hereinafter referred to as LSI) chip has been recently developed in which a number of semiconductor elements are packed onto a semiconductor substrate, in order to reduce the length of electric wiring among the elements. A circuit board on which the LSI chip is mounted has also been developed, wherein base boards are laminated and are provided with electric wiring that is very densely formed to electrically connect the LSI chip to external circuits. Moreover, a method of mounting a number of LSI chips on the circuit board has also been developed. To maintain operation parameters of the LSI chip within predetermined ranges and to prevent the LSI chip from being destroyed by overheating, the heat generated by the operation must be efficiently externally radiated.

When the density of mounting the LSI chips is low and little heat is generated, it is accepted practice to employ a cooling method of the type in which a heat radiating member is cooled by the forced convection of air, with the heat radiating member being connected, via a heat relay medium, to the LSI chip that is a source of heat. However, as the density of mounting the chips increases and heat is generated in increased amounts, it becomes necessary to sufficiently cool heat radiating members having limited surface areas and for this purpose, the rate air flow must be increased. This, however, creates noise. Therefore, it is no longer possible to maintain LSI chips within a suitable operating temperature range unless some auxiliary cooling means is provided to replace the forced air-cooling system.

An auxiliary cooling means represented by a cooling system based upon air and liquid cooling is proposed in, for example, U.S. Pat. No. 3,741,292, wherein a module is provided in which heat-generating components are immersed in a portion surrounded by a low-melting dielectric liquid that is contained in a capsule. The liquid is a fluorocarbon liquid having a low melting point, i.e., which boils at a relatively low temperature. That is, the liquid, receiving the heat from the heat-generating component turns into a vapor and migrating into a vapor portion located above the liquid level, is cooled as it passes through internal fins that are formed continuously from the container to the interior thereof and that work as a condenser, and is liquefied, thus forming a repetitive cycle. In this case, the external fins stretching from the container to the outside are air cooled to radiate the heat transmitted from the internal fins. Thus, the heat generated by the heat-generating components is radiated.

In a module containing a liquid capsule of this type, however, the fundamental process, i.e., boiling condensation, must be reliably executed. For this purpose, the cooling agent or liquid must be extremely pure and free of contaminants. The above-mentioned cooling concept cannot be easily adapted to cooling heat-generating components such as LSI chips. This is because, the substances constituting the LSI may be corroded by the liquid and impurities or contaminants in the liquid, are very likely to cause malfunctions.

In U.S. Pat. No. 3,993,123, a cooling module is proposed wherein one or more heat-generating devices such as semiconductor chips to be cooled, are contained in a capsule together with a gas. The heat-generating devices are mounted on an alumina plate and are sealed by the plate and by a cap. The space thus sealed is filled with an inert gas, and a heat-conducting member is arranged therein. Apertures are formed in the wall surface of the cap opposed to the plate with the apertures facing the heat-generating devices and stretching on axes concentric with the devices. An elastic member is disposed at the inner end of the aperture. The heat-conducting member is disposed in each of the apertures, and a narrow peripheral gap is formed between the wall surface of each aperture and the heat-conducting member. The elastic member imparts to the heat-conducting member a force such that the heat-conducting member is pressed onto the heat-generating device. The sealed space is filled with inert gas; i.e., the peripheral gap and the interface between the heat-generating device and the heat-conducting member are filled with inert gas. The heat generated by the heat-generating components is conducted to the gap via the inert gas and heat-conducting member, and is emitted to a heat sink that is coupled to the cap.

In the above-described capsule-sealed cooling module, the cap and the heat-conducting member are made of copper or aluminum, and the gas is composed of helium, hydrogen or carbon dioxide which have excellent thermal conductivity. By constituting heat-conducting paths from the heat-generating devices to the heat sink using these materials, the heat can be radiated highly efficiently. However, the cap and the heat-conducting member accounts for more than 50% of the total weight of the capsule-sealed cooling module. For instance, when a typical cooling module mounting ninety LSI chips, which heat-generating devices, is to be efficiently cooled, the weight increases to as much as 1.5 kg if copper is used to form the heat-conducting members and caps. The cooling module is generally connected by soldering to a printed board which carries auxiliary circuits via many connecting pins that protrude perpendicularly beyond the surface opposite to the surface of the board mounting the heat-generating devices, and that are secured by a gold-tin brazing or the like. Furthermore, the cooling module is so mounted that the surface of the printed board is in parallel with the pulling direction. Therefore, the total weight of the cooling module is supported by the pins and members connected thereto, such as a gold-tin-type brazing material or a solder. In operation, the cooling module receives a mechanical vibration that is transmitted from a housing that mounts the module via the printed board. However due to an excess load, the connection pins and connection members supporting the cooling module mechanically deteriorate at an accelerating rate, thereby causing malfunctions.

According to the above-mentioned typical cooling module, furthermore, the heat-conducting member has a weight of about 3.3 grams to maintain efficient cooling ability. Vibration in a direction perpendicular to the main surface of the heat-generating device is absorbed by the elastic member. However, vibration in a direction parallel to the main surface is absorbed little by the elastic member. That is, a gap exists between the wall surface of the aperture and the heat-conducting member, and the heat-conducting member composed of soft copper wears out at the point of contact with the heat-generating device accompanying the vibration. Accordingly, the electrically conductive powered material in the sealed module adheres to the electrically conductive paths that are electrically insulated from one another, thereby destroying the insulation, so that the device malfunctions. Similar wear also takes place between the wall surface in the aperture of the cap and the heat-conducting member. Furthermore, the problem of wear also takes place when aluminum is used for the cap and the heat-conducting member.

Further, the vibration of the heat-conducting member does more than trigger the slipping motion on the contacting surfaces between the heat-generating device and the heat-conducting member. For instance, when a resultant vibration, consisting of a component perpendicular to the main surface of the heat-generating device and a component in parallel therewith, is imparted, the perpendicular component of the resultant vibration may not be absorbed by the elastic member if the heat-conducting member is too heavy. Therefore, the heat-conductive member comes into point or line contact with the main surface, thereby decreasing thermal conduction. Moreover, pressing force is concentrated onto, or shock is imparted onto, a local portion of the heat-generating device. In this case, connecting members such as small solder pellets connected to the heat-generating device or connecting said heat-generating device to said board, deteriorate, i.e., they are cracked, split, or crushed at an accelerated rate. This problem is very noticable when the heat-conducting member is very heavy or when the tolerance of the gap increases between the cap and the heat-conducting member.

Further, heat-generating devices are mounted as densely as possible on the board in the sealed capsule. Each heat-generating device has a number of semiconductor elements that are integrated in a limited semiconductor substrate. In order for the individual semiconductor elements to form electric circuits, the individual elements may be electrically insulated, as required. Generally, therefore, a semiconductor element is formed in a semiconductor region that is usually called an island and that is electrically isolated by inversely biasing the pn junction. The problem here is that a voltage for inversely biasing the pn junction is applied to the semiconductor substrate, i.e., applied to the substrate of a heat-generating device that forms a contacting interface relative to the heat-conducting member. Only rarely do all of the heat-generating devices mounted on the base board have semiconductor substrates with the same function. Usually, it should be assumed that two or more heat-generating devices having dissimilar functions are mounted in the same cooling module. In such a case, it becomes necessary to maintain the inverse biasing voltages at two or more levels. However, the heat-generating devices served with inverse biasing voltages of different levels tend to be electrically communicated with one another via the heat-conducting member which is electrically conductive, elastic member, and cap so that predetermined inverse biasing is not maintained, and the cooling module malfunctions. The above-mentioned problem can be eliminated when all of the heat-generating devices mounted in the cooling module, have the same inverse bias. However, the probability remains that the cooling modules may be electrically communicated with each other via a heat sink that forms a contacting interface relative to the cap or via impurity substances or contaminating substances contained in the cooling agent, or that an electric network is formed by cooling modules that come into contact with each other when they vibrate on the printed boards that are very densely mounted in the housing. Therefore, the heat-generating devices mounted on the base board should not be electrically connected except in predetermined electrically conductive paths. For this reason, the cap or the heat-conducting member should be provided with electrical insulating properties.

A principal object of the present invention is to provide a heat-conducting cooling module having heat-conducting relay members or housings that efficiently cool the heat-generating devices that are to be cooled, and that maintain heat-conducting performance of heat-conducting paths from the heat-generating devices to a heat sink that radiates the heat.

Another object of the present invention is to provide a lightweight heat-conducting cooling module which prevents or reduces the deterioration of the connection pins and of the connection members, and to provide a lightweight heat-conducting cooling module which prevents or reduces deterioration of or damage to the connection members that electrically connect the heat-generating devices to the wiring of the base board or prevents or reduces the deterioration or damage to the heat-generating devices.

A further object of the present invention is to provide a heat-conducting cooling module equipped with heat-conducting relay members or housings which are resistant to wear and which have electrically insulating properties to prevent or reduce wear and conductivity among the electrically conductive paths, and to prevent electrical communication among one or more heat-generating devices to which a voltage is applied.

The heat-conducting cooling module of the present invention comprises at least one heat-generating device that is to be cooled, a housing contained in a heat-conducting path so as to be opposed to the heat-generating device, a heat-conducting relay member arranged so as to exchange the heat with respect to the surface wall of the housing, and resilient means for pressing the heat-conducting relay member onto heat-generating device to form a heat-conducting interface therebetween, wherein the housing or the heat-conducting relay member is made of a sintered product which consists of silicon carbide as a chief component.

According to the heat-conducting cooling module of the present invention, the housing or the heat-conducting relay member is made of a sintered product which consists of silicon carbide as a chief component, and which contains at least one of beryllium, beryllium oxide or boron nitride.

In the heat-conducting cooling module of the present invention, the housing or the heat-conducting relay member is made of a sintered product which includes of silicon carbide as a chief component, and which contains at least one of beryllium, beryllium oxide or boron nitride, and at least one of aluminum, silicon, iron, titanium or nickel, or oxides thereof or carbides thereof.

Moreover, the heat-conducting cooling module of the present invention comprises at least one heat-generating device that is to be cooled, a housing which has protrusions opposed to each of the heat-generating devices and which is contained in a heat-conducting path, a heat-conducting relay member which has opening portions in which the protrusions are arranged so that the heat is exchanged between the side walls of the opening portions and the surface walls of the protrusions, and resilient means that presses the heat-conducting relay member onto said heat-generating device to form a heat-conducting interface therebetween.

According to the heat-conducting cooling module of the present invention, the housing or the heat-conducting relay member is made of a sintered product having resistivity greater than $10^{10}$ ohms-cm According to the heat-conducting cooling module of the present invention, the thermal resistance of the heat-conducting path is adjusted in dependence upon the opposing areas between the surface wall of the projections of the housing and the side walls of the opening portions of the heat-conducting relay member.

The above-mentioned heat-conducting relay member and the housing has excellent heat conductivity which is nearly comparable to that of metals such as copper, aluminum, is as lightweight as possible, has resistance against wear, and has electrically insulating properties. It has been experimentally determined that a material having the above-mentioned properties includes a sintered silicon carbide having high density containing at least one of beryllium, beryllium oxide or boron nitride. More specifically, it has been determined that a sintered silicon carbide containing more than two parts by weight of beryllium (reckoned as beryllium oxide) or boron nitride per 100 parts by weight of silicon carbide exhibits thermal conductivity of 0.7 cal/° C.cm.S (at room temperature), a density of 3.2 g/cm$^3$, a Vickers' hardness of about 4000, a bending strength (supported at three points) of 45 kgf/mm$^2$, and an electric resistivity of $10^{13}$ ohms-cm or more (at room temperature), is suited for use as the heat-conducting relay member and the housing material.

The heat-conducting relay member and the housing made of the sintered silicon carbide exhibit increased electric resistance at the silicon carbide bonded grain boundaries owing to the presence of beryllium, beryllium oxide or boron nitride, exhibits electrical insulating properties inherent in the sintered product of silicon carbide, and is further imparted with thermal conductivity. In the sintered silicon carbide are remaining silicon, aluminum, iron, titanium and nickel, or oxides thereof, carbides thereof, as well as free carbon, that had been contained in the form of impurities in the starting materials. Among these impurities, aluminum decreases the resistivity of the sintered product of silicon carbide and should, therefore, be contained in small amounts. Aluminum also plays an important role in increasing the density of sintered silicon carbide, i.e., to decrease the porosity. The decrease in the porosity is significant in the process of sealing the package, as will be described later. In such a case, therefore, it is desired to add beryllium, beryllium oxide, or boron nitride in amounts to compensate for the reduction resistivity caused by aluminum.

In the heat-conducting cooling module of the present invention, the resistivity required for the heat-conducting relay member and the housing should be greater than $10^{10}$ ohms-cm, and thermal conductivity should be at least equal to, or greater than, that of aluminum (0.53 cal/cm.° C. S). To achieve this, two parts by weight or more of beryllium reckoned as beryllium oxide or boron nitride should be added to 100 parts by weight of the silicon carbide that is a chief component.

Further, the housing must sufficiently define a space for containing the heat-generating devices together with the base board or other members, and contain therein a gas such as helium for assisting in transferring the heat at the interface between the heat-conducting relay member and the housing or the heat-generating devices. This is because, helium has small atomic radii and escapes through very small gaps or pores. The hermetic seal is a serious problem, particularly when ceramic members are to be used as housing members, unlike the case of using metals. Ideally, the hermetic seal should be smaller than $10^{-7}$ atm ml/s reckoned as the leakage of helium. To maintain such a hermetic seal, the sintered silicon carbide should have a relative density greater than 97%. To obtain such a sintered product of silicon carbide, typically, a silicon carbide powder having particle diameter smaller than 2 um should be homogeneously kneaded with additives having similar particle sizes, insulating properties and heat conductivity. The mixture should then be temporarily molded at a pressure of about 98 MPa, and should be hot-pressed at a vacuum of $10^{-6}$ MPa at a temperature of 2050° C., at pressure of 30 MPa, and for one hour. The sintered silicon carbide contains silicon, aluminum, iron, titanium, and nickel, or oxides thereof, carbides thereof, as well as free carbon that had been contained as impurities in the starting materials, in addition to the additives used for imparting insulating properties or thermal conductivity. These impurities work effectively to intimately bond silicon carbide crystalline particles. In order to hermetically seal the sintered silicon carbide, it is desirable to add the above-mentioned silicon, aluminum, iron, titanium, nickel, or oxides thereof, or carbides thereof.

Moreover, to efficiently exchange heat between the heat-generating devices contained in the heat-conducting path and the heat-conducting relay member and between the heat-conducting relay member and the housing, the opposing areas between them should be as wide as possible, and the gaps should be as small as possible. In this sense, the heat-conducting relay member forming the interface between the heat-generating devices and the housing should be as large as possible. However, an increase in the size of the heat-conducting relay member increases the weight thereof, causing the heat-generating devices to be deformed or damaged, and further causing the members connecting such devices to the base board to deteriorate or be damaged. That is, when the opposing areas among the heat-conducting relay member, the heat-generating devices and the housing are to be maintained the same, the weight of the heat-conducting relay member can be reduced, and the heat-generating devices and the connection members can be prevented from deteriorating or being damaged when the heat-conducting relay member is arranged between the heat-generating devices and the housing having protrusions at portions opposed to the heat-generating devices, the heat-conducting relay member having opening portions at portions opposed to the protrusions, rather than when nearly a pole-shaped heat-conducting relay members are arranged between the heat-generating devices and the housing having openings at portions opposed to the heat-generating devices.

DETAILED DESCRIPTION

Figure 1:
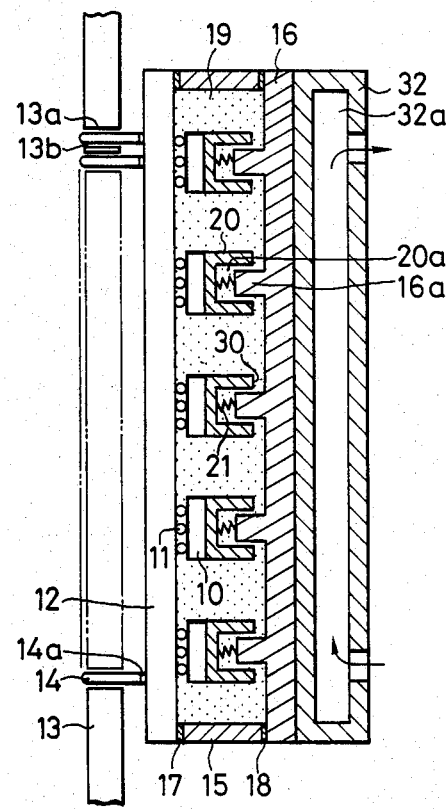
FIG. 1 is a schematic cross sectional view of a heat conducting cooling module constructed in accordance to one embodiment of the present invention.

Referring now to the drawings wherein like reference numerals are used throughout the various views to designate like parts and, more particularly, to FIG. 1, according to this figure, a plurality of LSI chips 10, i.e., a plurality of heat-generating devices, and a gas-filled heat-conducting cooling module having auxiliary cooling means to cool the heat-generating devices are provided with each LSI chip 10 forming a solid circuit having very densely mounted elements and wiring, and the electric power consumed by the circuit in the chip is converted into heat. A heat radiating means, described more fully hereinbelow, is provided in order to stably operate the circuit within predetermined ranges of operation parameters.

Each LSI chip 10 is usually mounted with small solder pellets 11 on one side of a ceramic multilayer wiring board 12 having connecting pins 14 extending from the other side thereof. The pins 14 are inserted in through-holes 13a of a wiring board 13 which carries auxiliary circuits, and are fastened by a connection member 13b such as solder or brazing material, to thereby support the heat-conducting cooling module which includes the base board 12 and various members associated therewith. The connection pins 14 are connected to the base board 12 by a gold-tin brazing material 14a. A spacer 15 of metal or ceramic is fastened to the peripheral portions of the base board 12 on the side mounting the chips 10, and a cap, i.e., a housing 16, is fastened to the other side of the spacer 15 by sealing members 17, 18 such as, for example, solder or brazing material. A closed space 19 is thus formed by these members. Material for the spacer 15 is selected by giving priority to whether the coefficient of thermal expansion thereof is close to that of the base board 12 and the housing 16 rather than from the standpoint of thermal conductivity. For example, when the base board 12 is made of alumina ceramic or mullite ceramic, the spacer 15 can be made of alumina ceramic, mullite ceramic, a sintered product of silicon carbide, Kovar, 58Fe-42Ni, tungsten carbide, or the like. The reason for giving priority to the coefficient of thermal expansion is to avoid fatigue and rupture of the sealing members that result from cyclic thermal changes being caused by the difference in the coefficient of thermal expansion between the spacer 15 and the base board 12 or the housing 16. Further, the material of the housing 16 should be selected from a standpoint such that its coefficient of thermal expansion is close to that of the spacer 15, and, more preferably, that its coefficient of thermal expansion is close to that of the base board 12, in addition to the provision of the above-mentioned properties, in order to avoid fatigue and rupture. These requirements can be satisfied by the sintered silicon carbide to which are added at least one of beryllium, beryllium oxide or boron nitride. Protrusions 16a are provided on the inside of the housing 16, with the protrusions 16a being disposed in opposition to the LSI chips 10, and with heat-conducting relay members 20 having an opening 20a being arranged to be guided to the protrusions 16a, and a spring 21 arranged in the space formed between the protrusion 16a and the opening 20a. The spring 21 maintains the heat-conducting relay member 20 in contact with the LSI chip 10. Most desirably, the heat-conducting relay member 20 is made of sintered silicon carbide to which is added at least one of beryllium, beryllium oxide or boron nitride, because the above-mentioned properties are all provided. The opening 20a of the heat-conducting relay member 20 forms a small gap 30 relative to the side wall of the protrusion 16a of the housing 16. The gap 30 has a width which provides a margin such that the heat-conducting relay member 20 and the LSI chip 10 are brought into plane contact with each other on a flat plane. Further, the heat-conducting relay members 20 are impelled by springs 21 so as to be adapted to chips 10 having various heights.

The opening 20a is formed in the heat-conducting relay member 20, and a protrusion is formed on the housing 16, in order to reduce the weight of the heat-conducting relay member 20 and to prevent the chips 10 and small solder pellets 11 from being deteriorating or being damaged. The helium is contained in space 19 defined by the base board 12, spacer 15, and housing 16. Therefore, small gaps between the LSI chips 10 and the heat-conducting relay members 20, and gaps between the heat-conducting relay members 20 and the housing 16 are filled with helium to form a heat-conducting path by the gas.

As known, helium has a low molecular weight, passes through small gaps, conducts the heat well so as to reduce thermal resistance, is inert and is highly safe, is not corrosive or toxic; hence it is the most desirable gas. However, when there is some tolerance in the heat-radiating ability to maintain stable operation of the chips 10, it is possible to employ a gas such as hydrogen, carbon dioxide or nitrogen, or to employ a gaseous mixture consisting of two or more of the above-mentioned gases including helium. In this case, the type of gas or the mixing composition of gases should be selected in dependence upon the amounts of heat generated by the LSI chips 10 and the heat-radiating ability of the heat-conducting cooling module.

The space 19 maintains the hermetic seal, defined by the base board 12, spacer 15, housing 16, and sealing members 17, 18 that fasten these members, prevents the helium gas from escaping, and protects the interior from being corroded by the ambient atmosphere. From the standpoint of maintaining the hermetic seal and preventing fatigue and rupture, the sealing members 17, 18 should be composed of such a brazing material as a gold-type alloy which contains at least one of tin, lead, germanium, silicon, antimony, bismuth, cadmium, or gallium, or a lead-type, tin-type, or silver-type alloy which contains at least one of tin, lead, silver, antimony, indium, bismuth, copper, zinc, gold or cadmium.

It is also permissible to use a thermosetting resin composition or a thermoplastic resin composition in addition to the fastening means which is based upon a metal brazing material. In this case, in general, the resin composition offers a hermetic seal which is inferior to the metals. Therefore, a suitable gas to be contained must be selected. The seal can further be accomplished by the press-contacting method, anode coupling method or the like, as well as the fastening means which is based upon the use of a metal brazing material or a resin composition.

However, the LSI chips 10 are mounted on the base board 12 as densely as possible, and the circuit will malfunction if some of the LSI chips 10 are defective. In such a case, the entire heat-conducting cooling module must be replaced, or some of the LSI chips 10 must be replaced. The latter method may be desirable from the standpoint of economy. For this purpose, however, the LSI sealing portion must be opened to replace the chips 10. That is, the heat-conducting cooling module must be allowed to be open. Moreover, other connection portions such as small solder pellets 11 must not be adversely affected by the heat-treatment at the time of opening the sealing portion or sealing the module again. When the small solder pellets 11 are composed of a 95 lead—5 tin type solder from such a point of view, the sealing member 17 or 18 should be composed of a brazing material having a melting point lower than the solidifying point of the soldering material, such as 95 tin—5 silver alloy, 63 tin—37 lead alloy, 80 indium—15 lead—5 silver alloy, 50 tin—50 indium alloy, 34 tin—20 lead—46 bismuth alloy, 14 tin—29 lead—48—bismuth—10 antimony alloy, or the like.

The heat transmitted from the heat-conducting relay members 20 to the housing 16 is transmitted to a heat sink such as a cooling plate 32 mounted on the housing 16. As shown in FIG. 1, the surface of the housing 16 and the surface of the cooling plate 32 are formed flat so that the heat can be transmitted well therebetween. A cooling liquid is circulated in space 32a of the cooling plate 32 as indicated by the arrow to remove the heat transmission to the cooling plate 32, i.e., to efficiently cool the devices. A liquid such as water is desirable as the cooling liquid to cool efficiently. When the LSI chips 10 are not heated beyond a designed temperature during operation, an air-cooled heat sink may be employed in place of the above-mentioned cooling plate 32. In this case, however, consideration must be given to the problem of minimizing noise as a matter of course.

The heat generated by the LSI chip 10, a heat-generating device, is transmitted through the interface between the LSI chip 10 and the heat-conducting relay member 20, through the heat-conducting relay member 20, through a gap between the inner wall surface in the opening 20a of the heat-transmitted relay member 20 and the surface of the protrusion of the housing 16, through the housing 16, through the interface between the housing 16 and the cooling plate 32, and through the cooling plate 32, and is finally transmitted to the cooling liquid which is the heat sink. Any factor that interrupts the conduction of heat in any portion in the heat-conducting path, is not desirable from the standpoint of guaranteeing reliable operation of the LSI chip 10. In particular, the opposing areas between the inner walls of the opening 20a of the heat-conducting relay member 20 and the surface of protrusion 16a of the housing 16 markedly affects the cooling ability of the heat-conducting cooling module as a whole. That is, the cooling ability increases with the increase in the opposing areas. When the LSI chip 10 generates large amounts of heat, therefore, it is essential to correspondingly increase the opposing areas. To obtain desired opposing areas, therefore, the size of the protrusion 16a and the size of the opening 20a should be adjusted based on theoretical calculation or, preferably, based on the measurement in the manufacturing process.

Figure 2:
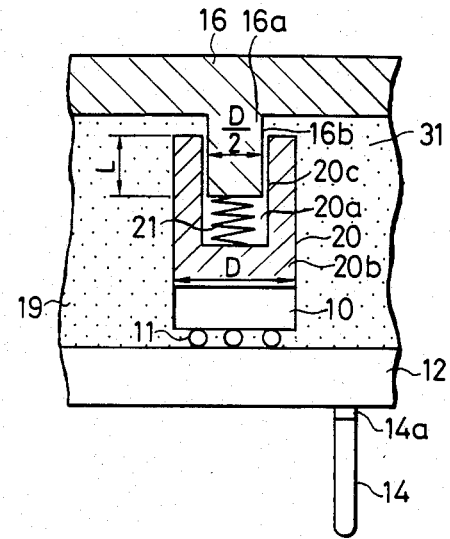
FIG. 2 is a partial cross-sectional view, on an enlarged scale, of a heat conducting relay member formed in a heat conducting path in which a heat-generating device to be cooled is arranged.
Figure 3:
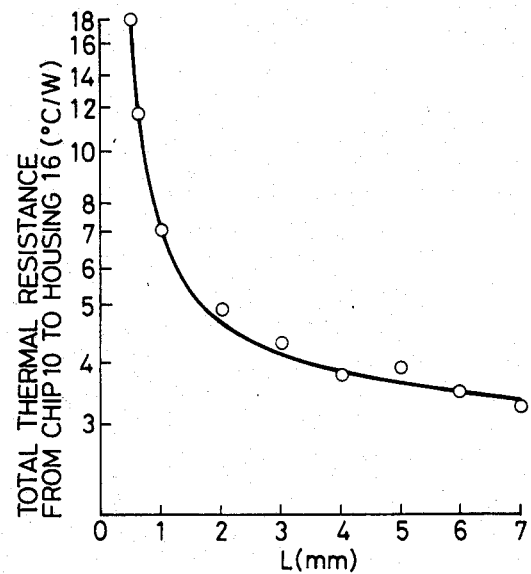
FIG. 3 is a graphical illustration of a thermal resistance of the heat-conducting path with respect to a length of the engaging portion between the heat-conducting relay member and a housing.

In FIG. 2 the diameter D is about 6.5 mm at the end 20b of the heat-conducting relay member 20 that is pressed by the spring 21 onto the chip 10, and the full length of the heat-conducting relay member 20 can be arbitrarily varied. A gap of about 0.025 mm is formed between the side wall 20c of the heat-conducting relay member 20a and the protrusion 16a of the housing 16a. The protrusion 16a has a diameter equal to D/2, and is 8.0 mm long. Therefore, the opposing length having a correlation to the opposing areas between the side wall 20c and the side wall 16b is denoted by L. Using these constant parameters, the total thermal resistance (° C/W) from the chip 10 to the housing 16 is plotted relative to the opposing length L (cm) to obtain a curve of thermal characteristics as shown in FIG. 3. As shown in FIG. 3, thermal resistance decreases with the increase in the length L; i.e., the heat-radiating ability of the heat-conducting cooling module can be controlled by adjusting the length L. It is evident from this that a plurality of LSI chips 10 that generate heat in different amounts and that are mounted on the same base board 12, can be maintained within predetermined operating temperature ranges by adjusting the length L, i.e., by adjusting the size of the heat-conducting relay members 20.

A problem, however, arises when the LSI chips 10 that generate heat in different amounts are mounted. That is, the heat-generating devices that consume small amounts of electric power are cooled too efficiently and are, hence, cooled excessively when the heat-generating devices that consume small amounts of electric power or that generate small amounts of heat and the heat-generating devices that consume large amounts of electric power or that generate large amounts of heat, are accommodated in the same container, or when a module consisting of only those heat-generating devices that consume small amounts of electric power and a module consisting of only those heat-generating devices that consume large amounts of electric power, are juxtaposed to each other. The heat-generating devices must be maintained at a temperature higher than a minimum operating temperature so that they can operate as designed. Further, if cooled excessively, an extended period of time is required for the heat-generating device to reach the minimum operation temperature. The problem of operating temperature is more marked in heat-generating devices that consume small amounts of electric power than in heat-generating devices that consume large amounts of electric power. Further, if juxtaposed semiconductor chips are heated at different operation temperatures, the individual chips exhibit nonuniform characteristics, making it difficult to obtain a module having desired characteristics.

Figure 4:
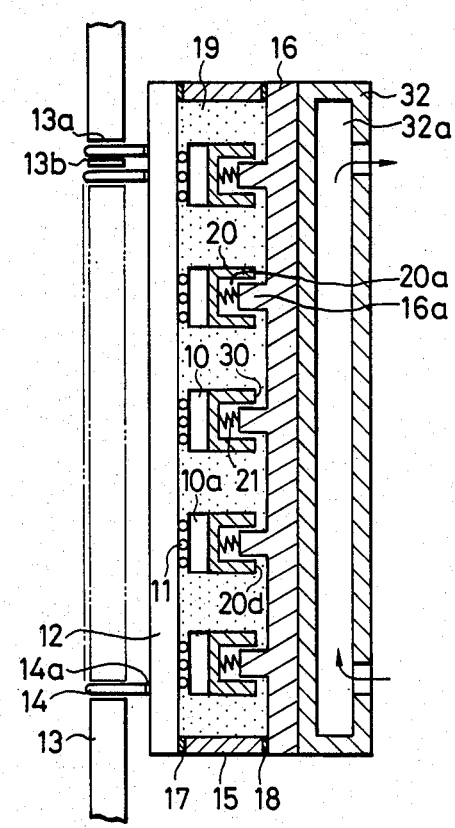
FIG. 4 is a schematic cross-sectional view of a heat-conducting cooling module according to another embodiment constructed in accordance with the present invention.

The feature of the apparatus of the embodiment of FIG. 4 resides in that the thermal resistance of heat-transmitting means interposed between a cooling means and a heat-generating device that generates a small amount of heat, is greater than the thermal resistance of heat-transmitting means interposed between a cooling means and a heat-generating device that generates a large amount of heat.

Usually, each LSI chip 10 is mounted with small solder pellets 11 on one surface of a ceramic multilayer wiring board 12. Reference numeral 10a denotes a small-power chip or a heat-generating device which consumes little power and generates little heat.

The heat generated by the heat-generating devices or chips 10, 10a is transmitted through the interface between the chips 10, 10a and the heat-conducting relay members 20, through the heat-conducting relay members 20, through gaps between the inner walls of the openings 20a of the heat-conducting relay members 20 and the surfaces of protrusions 16a of the housing 16, through the housing 16, through the interface between the housing 16 and the cooling plate 32, and through the cooling plate 32, and is finally transmitted to the cooling liquid which is the heat sink.

Figure 5:
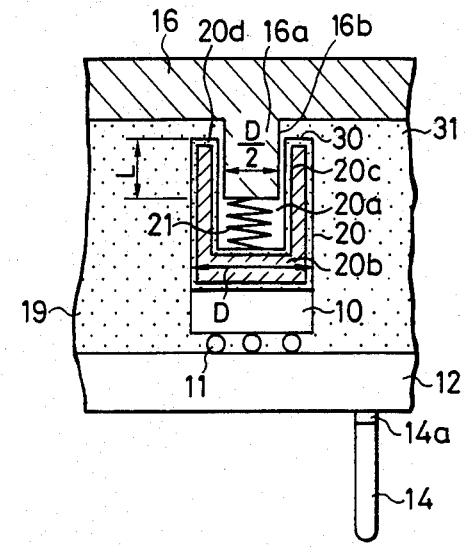
FIG. 5 is a partial cross-sectional view, on an enlarged scale, of a portion of FIG. 4.

FIG. 5 schematically illustrates the heat-conducting relay member 20 used in the heat-conducting path associated with the small-power chip 10a. Between the small-power chip 10a and the protrusion 16a of the housing 16 where heat-conducting means is constituted, on at least one side of the opposing surfaces of the protrusion 16 or the heat-conducting relay member 20 is coated with a silicon dioxide membrane 20d in order to increase the thermal resistance at the interface. The silicon dioxide membrane 20d has heat conductivity the value of which is only a few thousands of the heat-conductive sintered silicon carbide. Therefore, the silicon dioxide membrane 20d having high thermal resistance restrains the transmission of heat from the small-power chip 10a to the heat-conducting relay member 20 or the transmission of heat from the heat-conducting relay member 20 to the housing 16. Accordingly, the small-power chip 10a stores heat and is maintained within a predetermined operation temperature range. Most desirably, the silicon dioxide membrane 20d is formed by the thermal oxidation method. In this case, the silicon dioxide membrane is formed by heating a sintered product of silicon carbide in an atmosphere having an adjusted oxygen source, e.g., in an atmosphere containing water vapor and oxygen at a temperature of 1000° to 1500° C. However, the silicon dioxide membrane can also be formed by a chemical reaction such as the one represented by the chemical vapor deposition method, or by the sputtering method, in addition to the thermal oxidation method. The silicon dioxide membrane formed by these methods serves also as a carrier to increase thermal resistance.

In addition to the silicon dioxide membrane 20d, thermal resistance can also be increased by a carrier composed of an oxide of a metal such as germanium, aluminum, titanium, magnesium, lithium, zirconium, lead or zinc. In this case, the oxide can be formed by a thick film baking method, melt-injection method or the like, in addition to the sputtering method.

Figure 6:
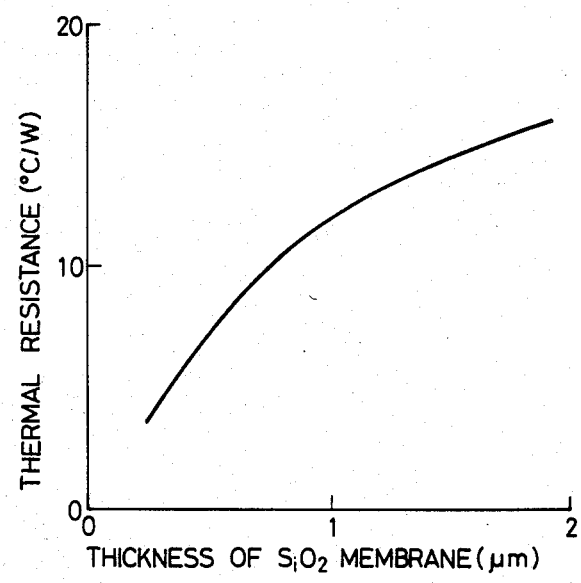
FIG. 6 is a graphical illustration of a relationship between a thickness of a silicon dioxide membrane and a thermal resistance of the heat-conducting path.

In the heat-conducting cooling module of the above-mentioned embodiment, the thermal resistance of heat-conducting means between the housing and the small-power chip 10a can also be adjusted relying upon the thickness of the silicon dioxide membrane 20d. For instance, the heat-conducting relay member 20 which is pressed by the spring 21 onto the chip 10a has a diameter D of about 6.5 mm at an end portion 20b thereof, and has a full length of 6.0 mm. A gap is about 0.025 mm between the side wall 20c of the opening 20a of the heat-conducting relay member 20 and the protrusion 16a of the housing 16. The protrusion 16a has a diameter which is equal to D/2 and is 8.0 mm long. Therefore, the opposing length L having a correlation to the opposing areas between the side wall 20c and the side wall 16b is 2.5 mm. Using these constant parameters, the total thermal resistance (°C./W) from the chip 10a to the housing 16 is plotted relative to the thickness (um) of the silicon dioxide membrane 20d to obtain a curve of thermal characteristics shown in FIG. 6. As indicated by the curve of FIG. 6, the thermal resistance increases with the increase in the thickness, from which it will be understood that the heat-radiating ability related to the heat-conducting path of small-power chip 10a can be controlled by adjusting the thickness of the silicon dioxide membrane 20d. Further, the heat-radiating ability of the heat-conducting path can also be adjusted by partly providing the heat-conducting relay member 20 with the silicon dioxide membrane 20d.

Figure 7:
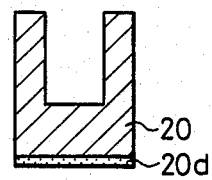
FIG. 7 is a schematic cross-sectional view, on an enlarged scale, of a heat-conducting relay member employed in the construction of the present invention.

In FIG. 7, the heat-conducting relay member 20 is selectively provided with the silicon dioxide membrane 20d on a portion that forms the heat-conducting interface between the heat-conducting relay member 20 and the chip 10a. By employing such a construction as shown in FIG. 7, the total thermal resistance from the chip 10a to the housing 16 can be adjusted to about one-third that of the case where the silicon dioxide membrane 20d is formed on the whole surface of the heat-conducting relay member 20. Furthermore, the heat-radiating ability of the heat-conducting path can be changed by adjusting the quality of the silicon dioxide membrane 20d, for example, by adjusting the density or porosity thereof.

In the heat-conducting cooling module of FIG. 7, the chips 10, 10a that are heat-generating devices are mounted as densely as possible. Each of the heat-generating device 10, 10a have a number of semiconductor elements that are integrated in a limited semiconductor substrate. The individual semiconductor elements must be electrically insulated, as required, to form an electric circuit. Therefore, the semiconductor elements are usually formed in a semiconductor region called an island that is electrically isolated by inversely biasing the pn junction. In this case, a voltage for inversely biasing the pn junction is applied to the semiconductor substrate, i.e., applied to the heat-generating devices 10, 10a that form contact interfaces relative to the heat-conducting members.

It seldom happens that all of the heat-generating devices 10, 10a mounted on the base board 12 are made up of semiconductor substrates having the same function. Generally, it should be considered that two or more heat-generating devices 10, 10a having dissimilar functions are mounted in the same cooling module. In such a case, inversely biasing voltages of two or more levels must be maintained. However, the heat-generating devices 10, 10a served with inversely biasing voltages of different levels are electrically communicated with each other via the electrically conductive heat-conducting relay members, springs 1 that serve as resilient members, and the housing 16 that serves as a cap;

i.e., predetermined in biasing conditions are not maintained, and the entire cooling module malfunctions. The above-mentioned problem can be eliminated when the inversely biasing conditions are quite the same for all the heat-generating devices mounted in the cooling module. However, the probability remains that the cooling modules may be electrically communicated with each other through the heat sink that forms a contacting interface being communicated with the cap or through impurities or contaminating substrate contained in the cooling medium, or that an electric network may be formed by mutual contact between closely packed cooling modules as they vibrate on the printed substrate. Therefore, the heat-generating devices mounted on the substrate should not be electrically communicated with each other outside the predetermined electrically conductive path. In this sense, the cap or the heat-conducting relay members should be provided with an electrically insulating function. In this embodiment electrical insulating properties are imparted by an additive to the sintered silicon carbide that serves as the heat-conducting relay member 20. Oxides of metals are effective to reliably impart electrically insulating properties to the sintered silicon carbide. Even when the sintered carbide has not been provided with the insulating property by the additive, the oxides of the metals impart the insulating to the sintered product of silicon carbide.

In order to reduce the weight of the heat-conducting relay member 20, and to prevent the chips 10, 10a or small solder pellets 11 from being adversely affected, i.e., to avoid chipping, cracking or crushing, according to this embodiment, an opening 20a is formed in the heat-conducting relay member 20 at a portion to thermally engage with the housing 16. However, the sintered silicon carbide has a density of as low as 3.2 g/cm$^3$, and can serve as a light-weight heat-conducting relay member. Therefore, even when openings are formed in the housing, and the heat-conducting relay members having a pole-like shape are arranged in the openings, the pole-like members having a membrane to increase thermal resistance on the heat-conducting interface thereof can be used as heat-conducting relay members for low-power chips, to the extent that they are not adversely affected as described above.

Furthermore, in the heat-conducting cooling module of the present invention, the housing 16 also serves as a heat sink that comes into direct contact with the cooling medium outside the sealed module, without presenting any problem. That is, the housing 16 can be directly cooled by the water or the air that serves as a cooling medium.

In order to avoid fatigue and rupture, the material of the housing 16 should be selected from a standpoint such that its coefficient of thermal expansion is close to that of the spacer 15 or such that it has excellent heat conductivity. Because of these reasons, the housing 16 should be made of a sintered product of silicon carbide containing the aforementioned additive. However, when the heat sink exhibits efficient cooling properties and the temperature change is small in the sealing portion of the spacer 15 or, in other words, when the sealing member 18 is prevented from fatigue or rupture, the housing 16 may be made of a metal having high thermal conductivity, such as copper, aluminum, or the like.

Figure 8:
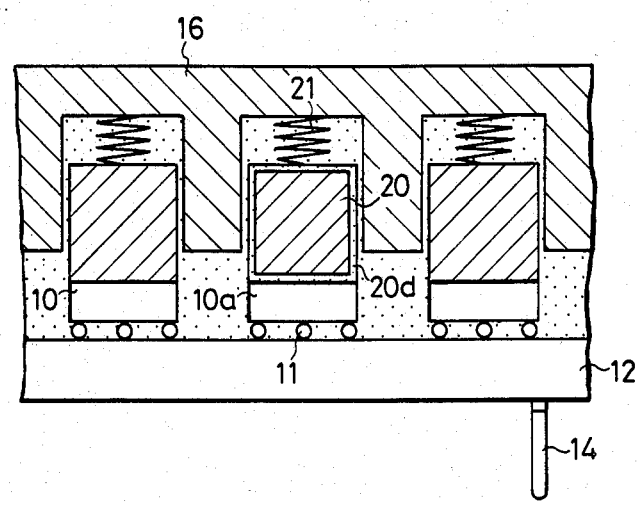
FIGS. 8–10 are schematic cross-sectional views, on an enlarged scale, of major portions according to further embodiments of the present invention.

In the embodiment of FIG. 8 the small-power chip 10a is mounted on the base board 12 together with other chips 10. Openings 16g are formed in the housing 16 to oppose to the chips 10, 10a, pole-like heat-conducting relay members 20 are arranged in the openings 16g, and the chips 10, 10a are pressed onto the heat-conducting relay members 20 by springs 21. The silicon dioxide membrane 20d is formed on the surface of the heat-conducting relay member 20 in the heat-conducting path of the small-power chip 10a, to adjust the thermal resistance of the heat-conducting path. Therefore, the small-power chip 10a is maintained in a predetermined operation temperature range. In the embodiment of FIG. 8, the heat-conducting relay members 20 are guided into the openings 16g of the housing 16. Compared with the construction of FIG. 2, therefore, the housing 16 is rather heavy. Even in this case, it is possible to avoid the problem of connecting portions related to the connection pins 14, as a matter of course.

Figure 9:
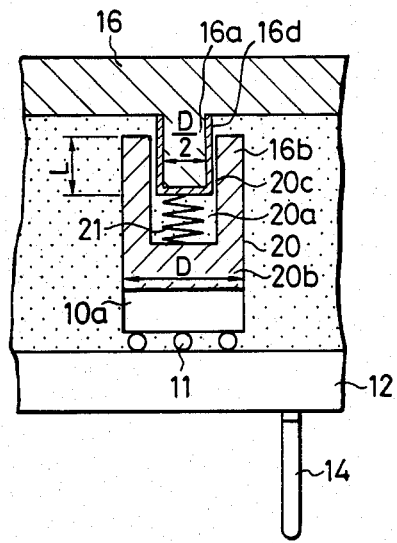
Figure 10:
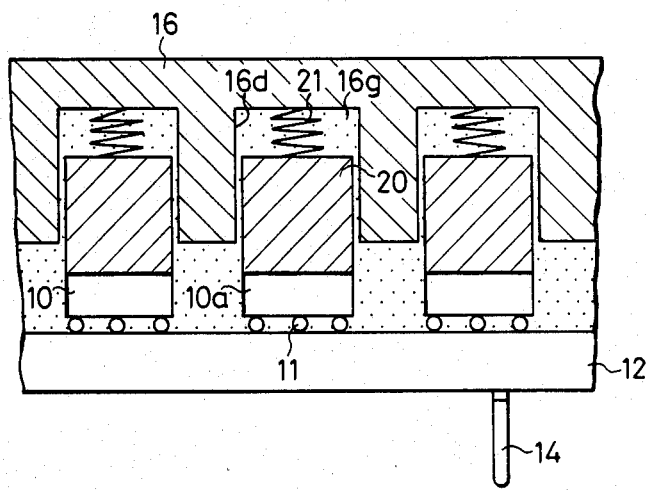

FIGS. 9 and 10 illustrate embodiments in which a carrier 20d for increasing the thermal resistance shown in the embodiments of FIGS. 5 and 8 is provided on the side of the housing 16. In this case, the carrier 16d for increasing the thermal resistance can be formed using the same material and in the same manner as the carrier 20d for increasing the thermal resistance of FIGS. 5 and 8. The thermal resistance can be adjusted depending upon the inner diameter, outer diameter, or length of the heat-conducting relay member 20, or protrusion 16a or opening of the housing 16, or depending upon the material, thickness and the like of the carrier 16d for increasing the thermal resistance. While we have shown and described several embodiments in accordance with the present invention, it is understood that the described embodiments can be modified in a variety of other ways. For example, in FIGS. 5 and 8, a predetermined number of dimples may be provided in the opposing surfaces between the heat-conducting relay member and the housing instead of providing the silicon dioxide membrane. Furthermore, in FIGS. 5 and 8, the heat-conducting relay member contacting a large-power chip may be composed of a metal and the surface thereof may be coated with the silicon dioxide membrane to effectively realize the invention.

According to the present invention as described above, it is possible to obtain a heat-conducting cooling module having excellent cooling efficiency.

According to the present invention, furthermore, the operation temperature can be made nearly uniform regardless of the amounts of heat generated by the heat-generating devices. Therefore, a number of devices that generate the heat in different amounts can be cooled by the same cooling means by changing the heat-conducting means, thereby to simplify the construction.

What is claimed is:

1. A heat conducting cooling module comprising:
   at least one heat-generating device that is to be cooled;
   a housing contained in a heat-conducting path so as to be opposed to the heat-generating device;
   a heat-conducting relay member which is so arranged as to exchange the heat with respect to the surface wall of the housing; and
   resilient means which presses said heat-conducting relay member onto said heat-generating device to form a heat-conducting interface therebetween;
   wherein said housing or said heat-conducting relay member is made of a sintered product which consists of silicon carbide as a chief component.

2. A heat-conducting cooling module according to claim 1, wherein said housing or said heat-conducting relay member is made of a sintered product which consists of silicon carbide as a chief component, and which contains at least one of beryllium, beryllium oxide or boron nitride.

3. A heat-conducting cooling module according to claim 1, wherein said housing or said heat-conducting relay member is made of a sintered product which consists of silicon carbide as a chief component, and which contains at least one of beryllium, beryllium oxide or boron nitride, and at least one of aluminum, silicon, iron, titanium, or nickel, or oxides thereof or carbides thereof.

4. A heat-conducting cooling module according to claim 1, which further comprises:
- at least one heat-generating device that is to be cooled;
- a housing which has protrusions opposed to each of the heat-generating devices and which is contained in a heat-conducting path;
- a heat-conducting relay member which has an opening portion in which said proturusion is arranged so that the heat is exchanged between the side wall of the opening portion and the surface wall of the protrusion; and
- resilient means that presses said heat-conducting relay member onto said heat-generating device to form a heat-conducting interface therebetween.

5. A heat-conducting cooling module according to claim 4, wherein the thermal resistance of said heat-conducting path is adjusted in relation to the opposing areas between the surface wall of the protrusion of said housing and the side wall of the opening portion of said heat-conducting relay member.

6. A heat-conducting cooling module according to claim 1, wherein said housing or said heat-conducting relay member is made of a sintered product which has an electric resistivity of greater than $10^{10}$ ohms-cm.

7. A heat-conducting cooling module comprising:
- heat-generating devices for generating heat in different amounts;
- a sealed container for accommodating said heat generating devices;
- cooling means disposed outside the sealed container for cooling said heat generating devices; and
- heat transmitting means which thermally connect said heat-generating devices to said cooling means, said heat transmitting means including a cylinder provided between the heat generating devices and the container, and a piston that is guided in said cylinder, the heat transmitting means on a side of large thermal resistance has an insulating membrane at a portion that serves as a heat-transmitting path for the cylinder and the piston; and
- wherein heat-transmitting means arranged between the heat-generating devices that generate heat in small amounts and said cooling means have a thermal resistance larger than that of a thermal resistance of the heat transmitting means arranged between the heat-generating devices that generate heat in large amounts and said cooling means.

8. A heat-conducting cooling module according to claim 7, wherein said cylinder and piston are made of a sintered product which consists of silicon carbide as a chief component and which contains at least one of beryllium, beryllium oxide or boron nitride.

9. A heat-conducting cooling module according to claim 7, wherein the insulating membrane consists of an oxide of at least one of silicon, germanium, aluminum, titanium, magnesium, lithium, zirconium, lead or zinc.

10. A heat-conducting cooling module comprising:
- heat-generating devices that are to be cooled and that consume small amounts of electric power;
- a housing which is contained in a heat-conducting path so as to be opposed to each of said heat-generating devices;
- heat-conducting relay members that are so arranged as to exchange the heat with respect to the surface wall of the housing; and
- resilient means which presses said heat-conducting relay member onto said heat-generating device to form a heat-conducting interface therebetween;
- wherein said housing is made of a sintered product consisting of silicon carbide as a chief component, and is provided with an insulating oxide having high thermal resistance at a portion to exchange the heat in the heat-transmitting path related to said heat-generating device that consumes little electric power.

11. A heat-conducting cooling module according to claim 10, wherein said housing is made of a sintered product which consists of silicon carbide as a chief component, and which contains at least one of beryllium, beryllium oxide or boron nitride, and said insulating oxide is composed of an oxide of at least one metal selected from silicon, germanium, aluminium, titanium, magnesium, lithium, zirconium, lead or zinc, said insulating oxide having high thermal resistance which is provided in a portion to exchange the heat in the heat-conducting path related to said heat-generating device that consumes little electric power.

12. A heat-conducting cooling module according to claim 11, wherein said housing is made of a sintered product which consists of silicon carbide as a chief component, and which contains at least one of beryllium, beryllium oxide or boron nitride, as well as aluminum, silicon, iron, titanium, nickel, or an oxide thereof or a carbide thereof.

* * * * *